(12) United States Patent
Ro et al.

(10) Patent No.: US 8,603,869 B2
(45) Date of Patent: Dec. 10, 2013

(54) METHOD OF FABRICATING THIN FILM TRANSISTOR HAVING AMORPHOUS AND POLYCRYSTALLINE SILICON

(75) Inventors: Jae-Sang Ro, Seoul (KR); Won-Eui Hong, Seoul (KR)

(73) Assignee: Ensiltech Corporation (KR)

( * ) Notice: Subject to any disclaimer, the term of this patent is extended or adjusted under 35 U.S.C. 154(b) by 351 days.

(21) Appl. No.: 12/743,889

(22) PCT Filed: Nov. 20, 2008

(86) PCT No.: PCT/KR2008/006852
§ 371 (c)(1),
(2), (4) Date: May 20, 2010

(87) PCT Pub. No.: WO2009/066943
PCT Pub. Date: May 28, 2009

(65) Prior Publication Data
US 2010/0244038 A1    Sep. 30, 2010

(30) Foreign Application Priority Data

Nov. 20, 2007 (KR) .................. 10-2007-0118674
Dec. 6, 2007 (KR) .................. 10-2007-0126162

(51) Int. Cl.

| H01L 21/00 | (2006.01) |
|---|---|
| H01L 21/84 | (2006.01) |
| H01L 29/08 | (2006.01) |
| H01L 35/24 | (2006.01) |
| H01L 51/00 | (2006.01) |
| H01L 29/04 | (2006.01) |
| H01L 29/10 | (2006.01) |
| H01L 31/00 | (2006.01) |
| H01L 29/12 | (2006.01) |
| H01L 29/786 | (2006.01) |
| H01L 27/14 | (2006.01) |
| H01L 29/15 | (2006.01) |

(52) U.S. Cl.
USPC ............. 438/158; 438/99; 257/40; 257/59; 257/71; 257/72; 257/E21.414; 257/E29.294

(58) Field of Classification Search
None
See application file for complete search history.

(56) References Cited

U.S. PATENT DOCUMENTS 5,270,567 A    12/1993  Mori et al.
6,204,519 B1 *  3/2001  Yamazaki et al. ............. 257/72
(Continued)

FOREIGN PATENT DOCUMENTS

| KR | 10-2004-0051006 | 6/2004 |
| KR | 10-2004-0102350 | 12/2004 |
| KR | 10-2006-0060334 | 6/2006 |

OTHER PUBLICATIONS

Korean Office Action—KR 10-2007-0126162 dated Jan. 19, 2009, citing KR 10-2006-0060334.

(Continued)

*Primary Examiner* — Michael Jung
(74) *Attorney, Agent, or Firm* — Cantor Colburn LLP

(57) ABSTRACT

Provided are thin film transistor, a method of fabricating the same, a flat panel display device including the same, and a method of fabricating the flat panel display device, that are capable of applying an electric field to a gate line to form a channel region of a semiconductor layer of a thin film transistor using a polysilicon layer crystallized by a high temperature heat generated by Joule heating of a conductive layer. As a result, a process can be simplified using a gate line included in the thin film transistor as the conductive layer, and the channel region of the semiconductor layer can be formed of polysilicon having a uniform degree of crystallinity. The thin film transistor includes a straight gate line disposed in one direction, a semiconductor layer crossing the gate line, and source and drain electrodes connected to source and drain regions of the semiconductor layer.

8 Claims, 9 Drawing Sheets

(56) References Cited

U.S. PATENT DOCUMENTS

| | | | |
|---|---|---|---|
| 6,709,901 B1* | 3/2004 | Yamazaki et al. | 438/149 |
| 6,818,485 B2 | 11/2004 | Morosawa | |
| 7,098,062 B2* | 8/2006 | Shih | 438/30 |
| 2004/0137671 A1* | 7/2004 | Kim | 438/166 |
| 2004/0211961 A1* | 10/2004 | Koo et al. | 257/59 |
| 2004/0266082 A1 | 12/2004 | You | |
| 2005/0243234 A1* | 11/2005 | Jung | 349/43 |
| 2007/0099352 A1* | 5/2007 | Ro et al. | 438/149 |
| 2007/0176177 A1* | 8/2007 | Jung et al. | 257/59 |
| 2007/0229723 A1* | 10/2007 | Huang | 349/43 |
| 2008/0116457 A1* | 5/2008 | Park et al. | 257/59 |
| 2008/0173871 A1* | 7/2008 | Noda et al. | 257/59 |

OTHER PUBLICATIONS

Decision of Grant—KR 10-2007-0126162 dated Apr. 17, 2009, citing KR 10-2006-0060334 and KR 10-2004-0051006.
International Search Report—PCT/KR2008/006852 dated Apr. 29, 2009.
Written Opinion—PCT/KR2008/006852 dated Apr. 29, 2009.
Taiwanese Office Action—Taiwanese Application No. 097144775 issued on Mar. 15, 2013, citing US2004/0211961, US6818485, US2007/0099352, US7098062, US2005/0243234 and US2004/0137671.

* cited by examiner

METHOD OF FABRICATING THIN FILM TRANSISTOR HAVING AMORPHOUS AND POLYCRYSTALLINE SILICON

TECHNICAL FIELD

The present invention relates to a thin film transistor (TFT), a method of fabricating the same, a flat panel display device including the same, and a method of fabricating the flat panel display device. In particular, the present invention relates to a thin film transistor, a method of fabricating the same, a flat panel display device including the same, and a method of fabricating the flat panel display device, that are capable of applying an electric field to a gate line included in a thin film transistor to form a channel region of a semiconductor layer of the thin film transistor using a polysilicon layer crystallized by a high temperature heat generated by Joule heating of a conductive layer. As a result, a process can be simplified using the gate line included in the thin film transistor as the conductive layer, and the channel region of the semiconductor layer can be formed of polysilicon having a uniform degree of crystallinity.

BACKGROUND ART

In general, amorphous silicon (a-Si) has disadvantages such as low mobility of an electron which is a charge carrier, a lower aperture ratio, disharmony with a CMOS process, and so on. On the other hand, a polysilicon thin film transistor allows a drive circuit required for entry of an image signal into a pixel to be formed on a substrate together with a pixel TFT array, which has been impossible in an amorphous silicon TFT. Therefore, since the polysilicon TFT requires no connection between a plurality of terminals and a driver IC, it is possible to increase productivity and reliability and reduce the thickness of a panel. In addition, since a polysilicon TFT process can use fine forming technology of a silicon LSI as it is, it is possible to form a fine structure in an interconnection, and so on. As a result, since there is no limitation in pitch for TAB mounting of the driver IC in the amorphous silicon TFT, it is possible to readily reduce the pixel size and form a plurality of pixels in a small angle of view. In comparison with the TFT using amorphous silicon, the TFT using polysilicon in an active layer has high switching performance and a channel position of the active layer is determined through self alignment to enable fabrication of a compact device and CMOS. Therefore, the polysilicon TFT has been used as a pixel switch device of an active matrix flat panel display (for example, a liquid crystal display, an organic light emitting diode display device, and so on) to realize a chip on glass (COG) product in which a screen size is increased and a driver is installed.

The inventors have filed Korean Patent Application No. 2004-37952, which discloses a method of crystallizing an amorphous silicon layer into a polysilicon layer. According to the method, a conductive layer is formed on the amorphous silicon layer, and an electric field is applied to the conductive layer to induce Joule heating to thereby generate a high temperature heat. As a result, better crystallization, activation of dopant, a thermal oxidation process, and recovering of crystal lattice defects can be performed at a lower temperature, preferably a normal temperature within a shorter time than the conventional art. In addition, it is possible to prevent damage to the substrate due to the high temperature. However, when the method is applied to an actual process of fabricating a polysilicon TFT, a separate conductive layer must be formed.

Meanwhile, when a wire used in the TFT is used as the conductive layer for inducing Joule heating in order to solve the problems without forming the separate conductive layer, the following problems may occur.

FIG. 1 is a plan view of a conventional TFT used in a flat panel display.

Referring to FIG. 1, a straight gate line 100 is disposed in one direction. A gate electrode 101 is disposed to be connected to the gate line 100 in a vertical direction. A semiconductor layer 102 crossing the gate electrode 101 is disposed not to overlap the gate line 100. In addition, source and drain electrodes 103a and 103b are disposed to be connected to source and drain regions of the semiconductor layer 102.

In the conventional TFT structure, when an electric field is applied to the gate line 100 to crystallize an amorphous silicon layer into a polysilicon layer by Joule heating, a sufficient amount heat cannot be transmitted to the gate electrode 101 such that the amorphous silicon layer disposed on a region crossing the gate electrode 101 cannot receive the sufficient amount of heat required for crystallization. As a result, even when the amorphous silicon layer, which is to be used as a semiconductor layer of the TFT, is not crystallized into the polysilicon layer or partially crystallized, crystallization of the polysilicon layer may be uneven to decrease characteristics of the TFT.

DISCLOSURE OF INVENTION

Technical Problem

In order to solve the foregoing and/or other problems, the present invention provides a thin film transistor, a method of fabricating the same, a flat panel display device including the same, and a method of fabricating the flat panel display device, that are capable of applying an electric field to a gate line included in a thin film transistor to form a channel region of a semiconductor layer of the thin film transistor using a polysilicon layer crystallized by a high temperature heat generated by Joule heating of a conductive layer. As a result, a process can be simplified using the gate line included in the thin film transistor as the conductive layer, and the channel region of the semiconductor layer can be formed of polysilicon having a uniform degree of crystallinity.

Technical Solution

One aspect of the present invention provides a thin film transistor including: a straight gate line disposed in one direction; a semiconductor layer crossing the gate line; and source and drain electrodes connected to source and drain regions of the semiconductor layer.

Another aspect of the present invention provides a method of fabricating a thin film transistor including: forming a straight gate line disposed in one direction on a substrate; sequentially forming a gate insulating layer and an amorphous silicon layer on the entire surface of the substrate; applying an electric field to the gate line to crystallize the amorphous silicon layer formed on a region overlapping the gate line into a polysilicon layer; patterning a silicon layer, in which the region overlapping the gate line is crystallized into the polysilicon layer, to form a semiconductor layer crossing the gate line; and forming source and drain electrodes connected to source and drain region of the semiconductor layer.

Still another aspect of the present invention provides a flat panel display device including: a substrate; a plurality of straight gate lines disposed in one direction on the substrate at predetermined intervals and a plurality of data lines insulated from the gate lines and disposed to cross the gate lines at predetermined intervals; and thin film transistors and capacitors disposed in unit pixel regions defined by the gate lines and the data lines, wherein the thin film transistor includes the gate line, a semiconductor layer crossing the gate line, and source and drain electrodes connected to source and drain regions of the semiconductor layer.

Yet another aspect of the present invention provides a method of fabricating a flat panel display device including: forming a straight gate line disposed in one direction and a lower electrode of a capacitor on a substrate; sequentially forming a gate insulating layer and an amorphous silicon layer on the entire surface of the substrate; applying an electric field to the gate line to crystallize the amorphous silicon layer formed on a region overlapping the gate line into a polysilicon layer; patterning a silicon layer, in which the region overlapping the gate line is formed of the polysilicon layer, to form a semiconductor layer crossing the gate line; and forming source and drain electrodes connected to source and drain regions of the semiconductor layer, a data line disposed perpendicular to the gate line and an upper electrode of the capacitor.

Advantageous Effects

According to the present invention, an electric field is applied to a gate line, which is a wire included in a thin film transistor to form a channel region of a semiconductor layer of the thin film transistor using a polysilicon layer crystallized by a high temperature heat generated through Joule heating of a conductive layer. Therefore, a process can be simplified using the gate line as the conductive layer, and the channel region of the semiconductor layer can be formed using polysilicon having a uniform degree of crystallinity.

BRIEF DESCRIPTION OF THE DRAWINGS

These and/or other aspects and advantages of the present invention will become apparent and more readily appreciated from the following description of exemplary embodiments of the invention, taken in conjunction with the accompanying drawings of which:

FIGS. 3, 5 and 6 are plan views, and FIGS. 4 and 7 are cross-sectional views taken along lines A-A' of FIGS. 3 and 6, respectively;

FIGS. 10, 13, 15 and 17 are plan views, and FIGS. 11, 14, 16 and 18 are cross-sectional views taken along lines B-B' of FIGS. 10, 13, 15 and 17, respectively.

Figure 1:
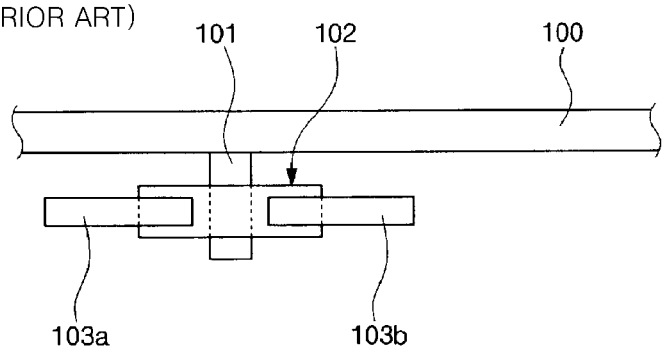
FIG. 1 is a plan view of a conventional thin film transistor used in a flat panel display device.

DESCRIPTION OF MAJOR REFERENCE NUMERALS 200, 302, 700, 802: Gate line
201, 305, 703, 807: Semiconductor layer
202a, 202b, 306a, 306b, 703b, 703c, 809a, 809b: Source and drain electrodes
701, 813: Data line
705, 805: Capacitor

MODE FOR THE INVENTION

Exemplary embodiments of the present invention will now be described in detail with reference to the accompanying drawings, throughout which like reference numerals refer to like elements.

Figure 2:
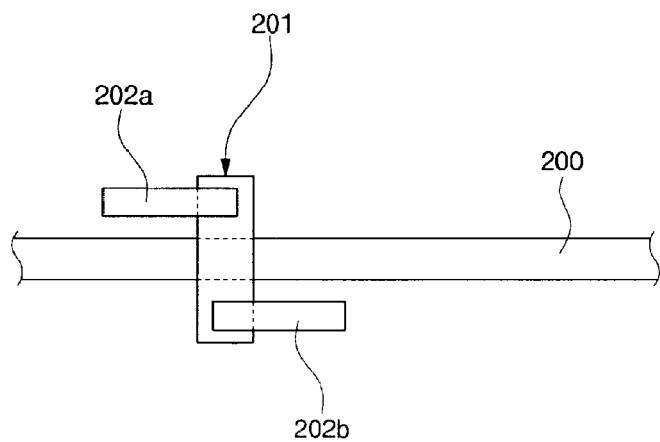
FIG. 2 is a plan view of a thin film transistor in accordance with a first exemplary embodiment of the present invention.

FIG. 2 is a plan view of a thin film transistor in accordance with a first exemplary embodiment of the present invention.

Referring to FIG. 2, a straight gate line 200 is disposed in one direction.

A semiconductor layer 201 is disposed to cross the gate line 200. Since the semiconductor layer 201 is disposed to cross the gate line 200, a certain region of the semiconductor layer 201 overlaps the gate line 200. In addition, the semiconductor layer 201 is disposed perpendicular to the gate line 200.

Source and drain electrodes 202a and 202b are disposed to be connected to source and drain regions of the semiconductor layer 201.

Figure 3:
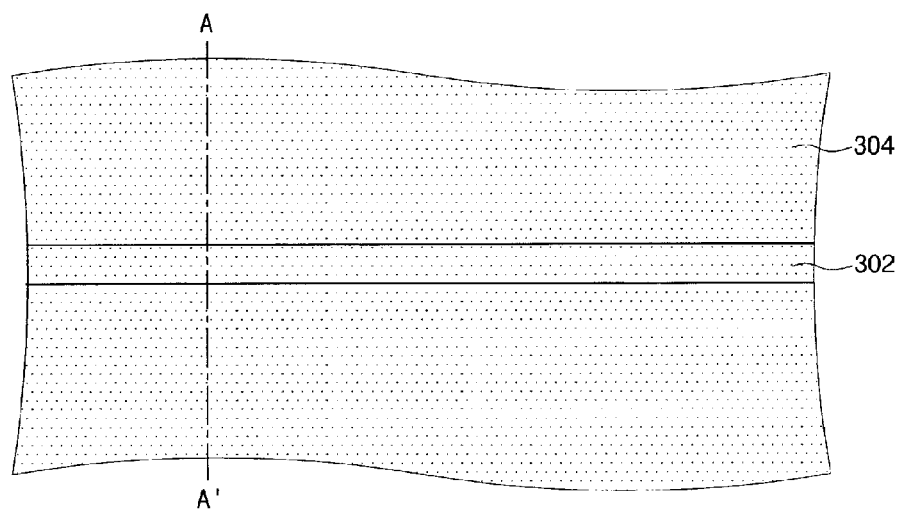
FIGS. 3 to 7 are plan views and cross-sectional views showing processes of fabricating the thin film transistor in accordance with a first exemplary embodiment of the present invention.
Figure 4:
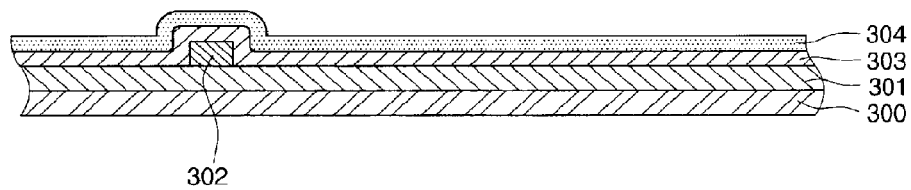
Figure 5:
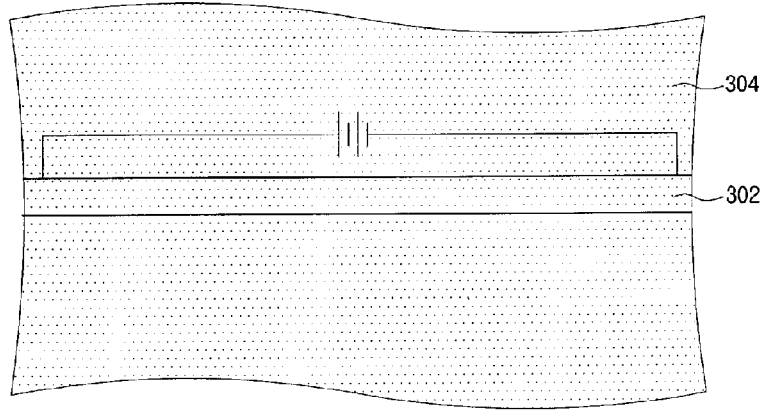
Figure 6:
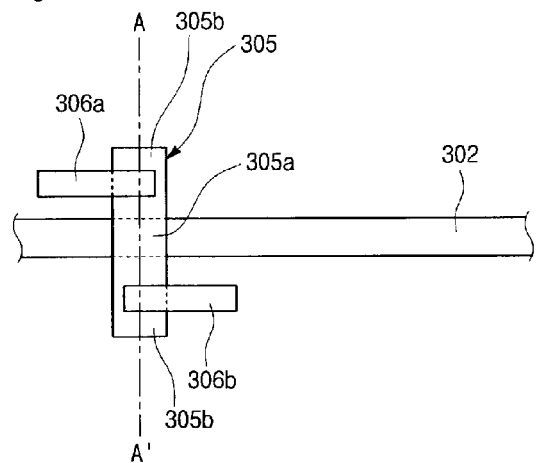
Figure 7:
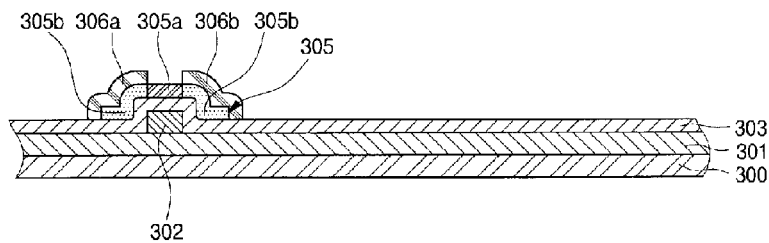

FIGS. 3 to 7 are plan views and cross-sectional views showing processes of fabricating the thin film transistor in accordance with a first exemplary embodiment of the present invention. FIGS. 3, 5 and 6 are plan views, and FIGS. 4 and 7 are cross-sectional views taken along lines A-A' of FIGS. 3A and 6, respectively.

Referring to FIGS. 3 and 4, a buffer layer 301 is formed on a substrate 300 formed of glass or plastic. The buffer layer 301 is formed as a single layer or a multi-layer using an insulating layer such as a silicon oxide layer or a silicon nitride layer through a chemical vapor deposition (CVD) method or a physical vapor deposition (PVD) method. Here, the buffer layer 301 functions to promote crystallization of the amorphous silicon layer by preventing diffusion of moisture or impurities generated from the substrate 300 or adjusting a heat transfer speed upon crystallization. The buffer layer 301 may have a thickness of 2000~5000 Å.

Then, a straight gate line 302 is formed on the substrate 300 in one direction. The gate line 302 may be formed of a metal or alloy having a melting point of 1300° C. or more.

The crystallization process in accordance with an exemplary embodiment of the present invention applies an electric field to the gate line 302 to form a polysilicon layer from an amorphous silicon layer through Joule heating. In this case, when the crystallization is performed at a high temperature of less than 1300° C., since the crystallization cannot be completed by application of the electric field at a time, the electric field application process may be repeated several times. In addition, when application of the electric field is repeated several times, in order to prevent generation of irregularity due to thermal accumulation, the electric field may be applied after several seconds from completion of the electric field application at a time. As a result, the total process time for crystallization may consume several minutes.

However, when the crystallization is performed at a high temperature of 1300° or more, crystallization can be completed by one application of the electric field, and a time consumed for the electric field application at a time is very short, about several hundreds of μsec. Therefore, when the crystallization is performed at a high temperature of 1300° or more, it is possible to remarkably reduce the total process time for crystallization. In addition, when the crystallization is completed at a high temperature for a short process time at a time, crystalline quality may also be improved.

The metal or alloy having a melting point of 1300° C. or more may be molybdenum (Mo), titanium (Ti), chrome (Cr), molybdenum-tungsten (MoW), and so on.

The gate line 302 may be formed by a method such as sputtering, evaporation, and so on, to a thickness of 500 to 3000 Å.

Then, a silicon oxide layer or a silicon nitride layer is deposited on the entire surface of the substrate 300, on which the gate line 302 is formed, to form a gate insulating layer 303. The gate insulating layer 303 functions to insulate the gate line 302 from the semiconductor layer and prevent contamination of an amorphous silicon layer, which is to be described, due to the gate line 302. The gate insulating layer 303 may have a thickness of 500 to 2000 Å.

Next, an amorphous silicon layer 304 is formed on the substrate 300 on which the gate insulating layer 303 is formed. The amorphous silicon layer 304 may be formed by a method, for example, low pressure chemical vapor deposition, normal pressure chemical vapor deposition, plasma enhanced chemical vapor deposition (PECVD), sputtering, vacuum evaporation, and so on, preferably, PECVD. The amorphous silicon layer 304 may have a thickness of 1100 to 5000 Å.

Next, referring to FIG. 5, an electric field is applied to the gate line 302 to crystallize the amorphous silicon layer 304 formed on a region overlapping the gate line 302 into a polysilicon layer. Before application of the electric field to the gate line 302, the substrate 300 may be preheated to an appropriate temperature range. The appropriate temperature range means a temperature range in which the substrate 300 is not damaged during the entire process, preferably, a range lower than a thermal deformation temperature of the substrate 300. The preheating may be preformed by, for example, a method of inserting the substrate into a general annealing furnace, a method of irradiating the substrate with radiant heat from a lamp, and so on, but not limited thereto.

Application of the electric field to the gate line 302 is performed by applying energy having a power density that can generate a large amount of heat to induce crystallization of the amorphous silicon layer 304 through Joule heating. As described above, when the energy having a power density capable of increasing a temperature to 1300° C. or more is applied, it is possible to reduce a process time.

Since the application of the electric field is determined by various factors such as resistance, length, thickness, and so on, of the gate line 302, it is difficult to specify the application. The applied current may be direct current or alternating current. An application time of the electric field for one time may be $1/1,000,000$~100 sec, preferably $1/1,000,000$~10 sec, most preferably, $1/1,000,000$~1 sec. The application of the electric field may be regularly or irregularly repeated several times. Therefore, while the total annealing time may be longer than the electric field application time, it is very short time in comparison with the conventional crystallization method.

Here, in a state in which the gate insulating layer 303 is disposed on the amorphous silicon layer 304, when the electric field is applied to the gate line 302 to crystallize the amorphous silicon layer 304 into a polysilicon layer through Joule heating, the polysilicon layer can provide conductivity at a high temperature. In this case, the polysilicon layer, the gate line 302 and the gate insulating layer 303 constitute a capacitor. When a potential difference generated upon constitution of the capacitor exceeds a dielectric breakdown voltage of the gate insulating layer 303, current may flow through the gate insulating layer 303 to generate arc. Therefore, in order to prevent generation of the arc, the gate insulating layer 303 may be configured to expose a portion of the gate line 302 disposed at an outer part of the substrate 300 such that the amorphous silicon layer 304 is in direct contact with the portion of the exposed gate line 302.

Referring to FIGS. 6 and 7, a silicon layer, in which the region overlapping the gate line 302 into the polysilicon layer, is patterned to form a semiconductor layer 305. At this time, the semiconductor layer 305 is patterned to cross the gate line 302. As a result, a certain region of the semiconductor layer 305 overlaps the gate line 302. In addition, the semiconductor layer 305 is disposed perpendicular to the gate line 302, i.e., a line connecting source and drain regions of the semiconductor layer 305 is perpendicular to the gate line 302.

When a separate crystallization process is not further performed, a channel region 305a of the semiconductor layer 305 overlapping the gate line 302 is a polysilicon layer, and a region 305b not overlapping the gate line 302 may be an amorphous silicon layer.

Then, a photoresist pattern (not shown) is formed on a region in which the semiconductor layer 305 overlaps the gate line 302, and P- or N-type impurities are implanted to form source and drain regions using the photoresist pattern as a mask.

Next, the photoresist pattern is removed to form source and drain electrodes 306a and 306b on the source and drain regions of the semiconductor layer 305. The source and drain electrodes 306a and 306b may be formed of any one selected from molybdenum (Mo), chrome (Cr), tungsten (W), aluminum-neodymium (Al—Nd), titanium (Ti), molybdenum-tungsten (MoW), and aluminum (Al).

Figure 8:
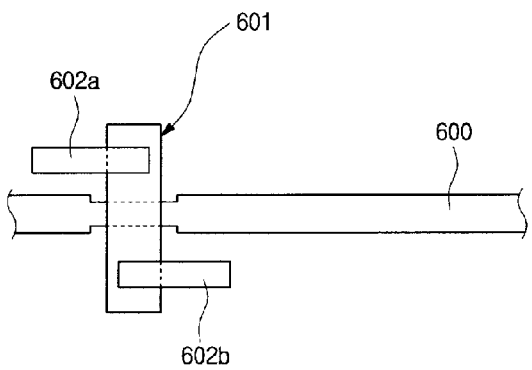
FIG. 8 is a cross-sectional view of a thin film transistor in accordance with a second exemplary embodiment of the present invention.

FIG. 8 is a cross-sectional view of a thin film transistor in accordance with a second exemplary embodiment of the present invention.

Referring to FIG. 8, a straight gate line 600 is disposed in one direction. A semiconductor layer 601 is disposed to cross the gate line 600. Since the semiconductor layer 601 is disposed to cross the gate line 600, a certain region of the semiconductor layer 601 overlaps the gate line 600.

In addition, source and drain electrodes 602a and 602b are disposed to be connected to source and drain regions of the semiconductor layer 601.

The gate line 600 of the thin film transistor in accordance with a second exemplary embodiment of the present invention disposed at a region crossing the semiconductor layer 601 has a width smaller than that of the gate line 600 disposed on the other region, unlike the first embodiment. As a result, as shown in FIG. 4, when the electric field is applied to the gate line to crystallize an amorphous silicon layer into a polysilicon layer, due to the small width of the gate line, a larger amount of heat may be generated from the region than the first embodiment having the uniform width of the gate line such that the crystallization is more effectively performed.

Figure 9:
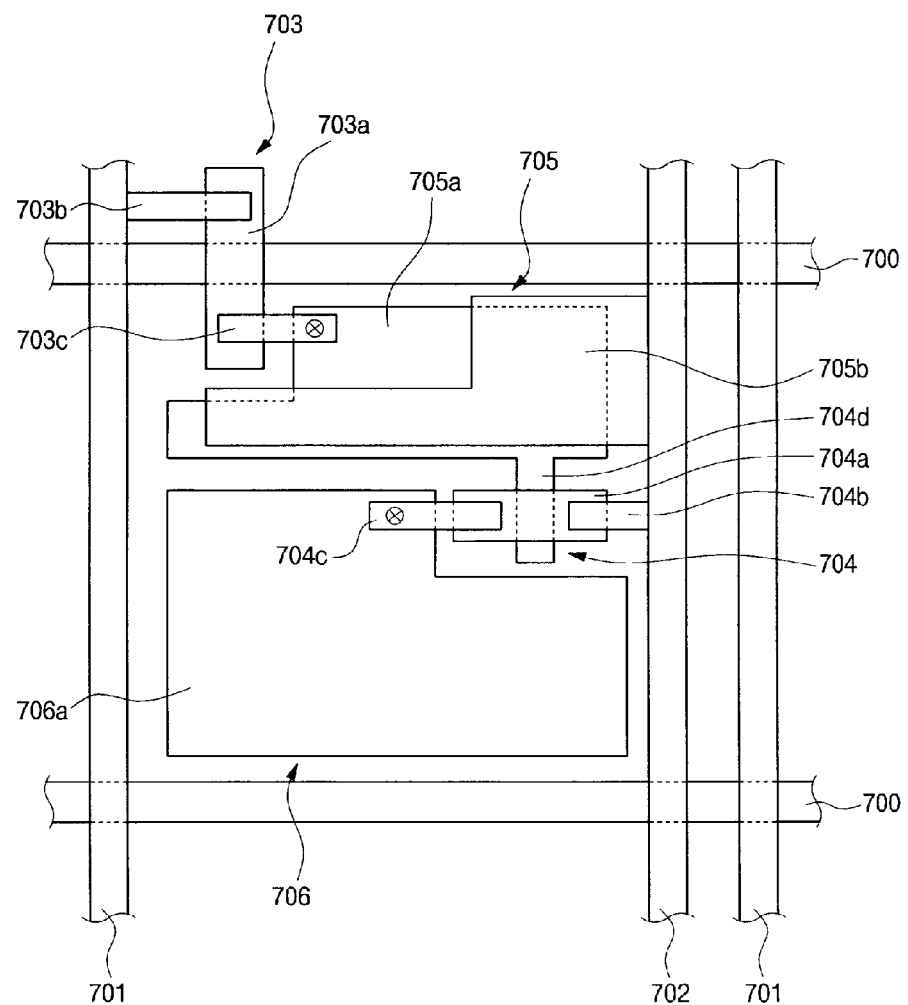
FIG. 9 is a plan view of a flat panel display device including the thin film transistor in accordance with a first exemplary embodiment of the present invention.

FIG. 9 is a plan view of a flat panel display device including the thin film transistor in accordance with a first exemplary embodiment of the present invention. In this embodiment, an organic light emitting diode display device will be described as an example of flat panel display devices, and an embodiment will be described with reference to the case in which the thin film transistor in accordance with a first exemplary embodiment of the present invention is included as a switching thin film transistor in the organic light emitting diode display device.

Referring to FIG. 9, a plurality of straight gate lines 700 are disposed in one direction at predetermined intervals. A plurality of data lines 701 are disposed to be insulated from the gate lines 700 and cross the gate lines 700 at predetermined intervals. A common power line 702 is disposed in the same direction as the data line 701 and spaced apart a predetermined distance from the data line 701. Unit pixels disposed in a matrix are defined by the plurality of gate lines 700, the plurality of data lines 701 and the plurality of common power lines 702. Each of the unit pixels includes a switching thin film transistor 703, a drive thin film transistor 704, a capacitor 705, and an organic light emitting diode 706.

The switching thin film transistor 703 is disposed on the gate line 700. The switching thin film transistor 703 includes the gate line 700, a semiconductor layer 703a including a channel region, and source and drain regions, and source and drain electrodes 703b and 703c connected to the source and drain region of the semiconductor layer 703a.

At this time, the semiconductor layer 703a of the switching thin film transistor 703 is disposed on the gate line 700 to cross the gate line 700. As a result, a certain region of the semiconductor layer 703a overlaps a certain region of the gate line 700. In addition, the semiconductor layer 703a is disposed perpendicular to the gate line 700 and parallel to the data line 701. Perpendicular arrangement of the semiconductor layer 703a to the gate line 700 means that a line connecting the source and drain regions of the semiconductor layer 703a is perpendicular to the gate line 700.

The source electrode 703b of the switching thin film transistor 703 is connected to the data line 701.

The drive thin film transistor 704 includes a semiconductor layer 704a including a channel region and source and drain regions, and source and drain electrodes 704b and 704c connected to source and drain regions of the semiconductor layer and a gate electrode 704d.

In addition, the capacitor 705 includes a lower electrode 705a connected to the gate electrode 704d of the drive thin film transistor 704 and simultaneously connected to the drain electrode 703c of the switching thin film transistor 703, and an upper electrode 705b connected to the common power line 702.

A pixel electrode 706a of the organic light emitting diode 706 is connected to the drain electrode 704c of the drive thin film transistor 704 through a via-hole.

FIGS. 10 to 18 are plan views and cross-sectional views showing processes of fabricating a flat panel display including the thin film transistor in accordance with a first exemplary embodiment of the present invention. In this embodiment, an organic light emitting diode display device will be described as an example of flat panel display devices, and an embodiment will be described with reference to the case in which the thin film transistor in accordance with a first exemplary embodiment of the present invention is included as a switching thin film transistor in the organic light emitting diode display device.

FIGS. 10, 12, 13, 15 and 17 are plan views, and FIGS. 11, 14, 16 and 18 are cross-sectional views taken along lines B-B' of FIGS. 10, 13, 15 and 17, respectively.

Figure 10:
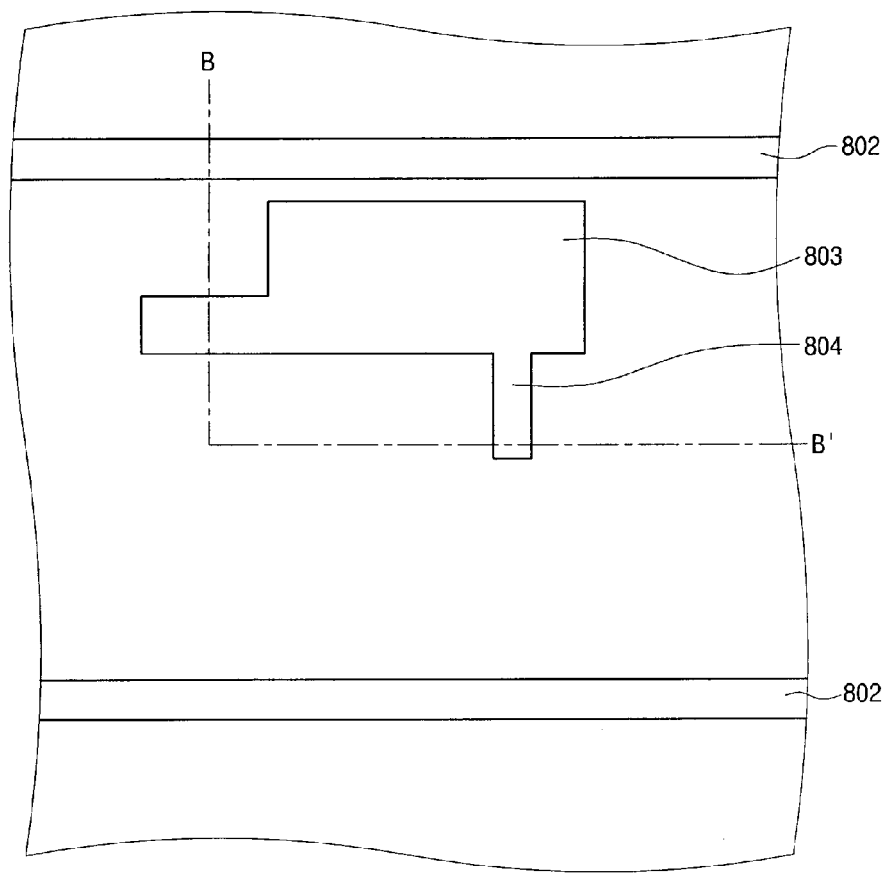
FIGS. 10 to 18 are plan views and cross-sectional views showing processes of fabricating a flat panel display including the thin film transistor in accordance with a first exemplary embodiment of the present invention.
Figure 11:
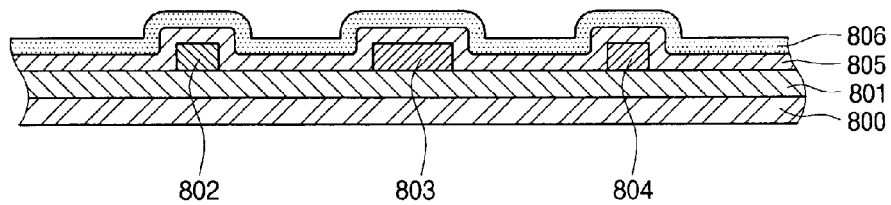

Referring to FIGS. 10 and 11, a buffer layer 801 is formed on a substrate formed of glass or plastic. The buffer layer 801 is formed as a single layer or a multi-layer using an insulating layer such as a silicon oxide layer or a silicon nitride layer through chemical vapor deposition (CVD) or physical vapor deposition (PVD). At this time, the buffer layer 801 functions to prevent diffusion of moisture or impurities generated from the substrate 800 and adjust a heat transfer speed upon crystallization such that the amorphous silicon layer can be crystallized well. The buffer layer 801 may have a thickness of 2000 to 5000 Å.

A plurality of straight gate lines 802 disposed on the substrate 800 in one direction at predetermined intervals, a gate electrode 804 of the drive thin film transistor, and a lower electrode 803 of the capacitor connected to the gate electrode 804 are formed. The gate line 802, the lower electrode 803 of the capacitor, and the gate electrode 804 of the drive thin film transistor may be formed of the same material, or different materials.

The gate line 802 may be formed of a metal or alloy having a melting point of 1300° C. or more.

A crystallization process in accordance with an exemplary embodiment of the present invention applies an electric field to the gate line 802 to crystallize an amorphous silicon layer into a polysilicon layer through Joule heating. In this case, when the crystallization is performed at a high temperature of less than 1300° C., since the crystallization may not be completed by one application of the electric field, the total application process may be repeated several times. In addition, when application of the electric field is repeated several times, in order to prevent generation of irregularity due to thermal accumulation, the electric field may be applied after several seconds from completion of the electric field application at a time. As a result, the total process time for crystallization may consume several minutes.

However, when the crystallization is performed at a high temperature of 1300° C. or more, crystallization can be completed by one application of the electric field, and a time consumed for the electric field application at a time is very short, about several hundreds of μsec. Therefore, when the crystallization is performed at a high temperature of 1300° C. or more, it is possible to remarkably reduce the total process time for crystallization. In addition, when the crystallization is completed at a high temperature for a short process time at a time, crystalline quality may also be improved.

The metal or alloy having a melting point of 1300° C. or more may be molybdenum (Mo), titanium (Ti), chrome (Cr), molybdenum-tungsten (MoW), and so on.

The gate line 802 may be formed by a method such as sputtering, evaporation, and so on, to a thickness of 500 to 3000 Å.

Then, a silicon oxide layer or a silicon nitride layer is deposited on the entire surface of the substrate 800, on which the gate line 802 is formed, to form a gate insulating layer 805. The gate insulating layer 805 functions to insulate the gate line 802 and the gate electrode 804 from the semiconductor layer and prevent contamination of an amorphous silicon layer, which is to be described, due to the gate line 802. The gate insulating layer 805 may have a thickness of 500 to 2000 Å.

Next, an amorphous silicon layer 806 is formed on the substrate 800 on which the gate insulating layer 805 is formed. The amorphous silicon layer 806 may be formed by a method, for example, low pressure chemical vapor deposition, normal pressure chemical vapor deposition, plasma enhanced chemical vapor deposition (PECVD), sputtering, vacuum evaporation, and so on, preferably, PECVD. The amorphous silicon layer 806 may have a thickness of 1100 to 5000 Å.

Figure 12:
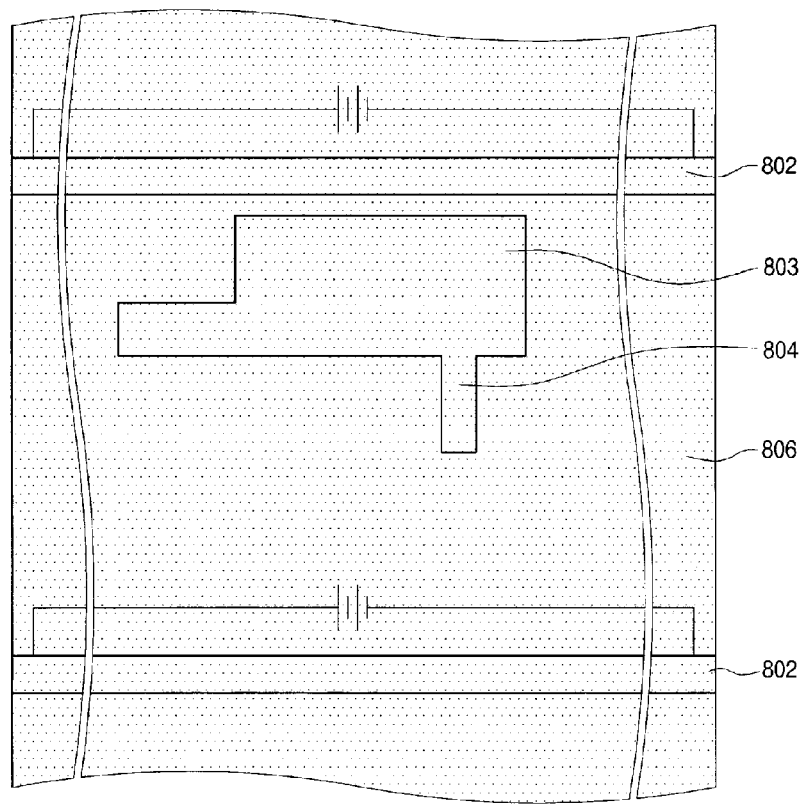

Next, referring to FIG. 12, an electric field is applied to the gate line 802 to crystallize the amorphous silicon layer 806 formed on a region overlapping the gate line 802 into a polysilicon layer. Before application of the electric field to the gate line 802, the substrate 800 may be preheated to an appropriate temperature range. The appropriate temperature range means a temperature range in which the substrate 800 is not damaged during the entire process, preferably, a range lower than a thermal deformation temperature of the substrate 800. The preheating may be preformed by, for example, a method of inserting the substrate into a general annealing furnace, a method of irradiating the substrate with radiant heat from a lamp, and so on, but not limited thereto.

Application of the electric field to the gate line 802 is performed by applying energy having a power density that can generate a large amount of heat to induce crystallization of the amorphous silicon layer 806 through Joule heating. As described above, when the energy having a power density capable of increasing a temperature to 1300° C. or more is applied, it is possible to reduce a process time.

Since the application of the electric field is determined by various factors such as resistance, length, thickness, and so on, of the gate line 802, it is difficult to specify the application. The applied current may be direct current or alternating current. An application time of the electric field for one time may be 1/1,000,000~100 sec, preferably 1/1,000,000~10 sec, most preferably, 1/1,000,000~1 sec. The application of the electric field may be regularly or irregularly repeated several times. Therefore, while the total annealing time may be longer than the electric field application time, it is very short time in comparison with the conventional crystallization method.

Here, in a state in which the gate insulating layer 805 is disposed on the amorphous silicon layer 806, when the electric field is applied to the gate line 802 to crystallize the amorphous silicon layer 806 into a polysilicon layer through Joule heating, the polysilicon layer can provide conductivity at a high temperature. In this case, the polysilicon layer, the gate line 802 and the gate insulating layer 805 constitute a capacitor. When a potential difference generated upon constitution of the capacitor exceeds a dielectric breakdown voltage of the gate insulating layer 805, current may flow through the gate insulating layer 805 to generate arc. Therefore, in order to prevent generation of the arc, the gate insulating layer 805 may be configured to expose a portion of the gate line 802 disposed at an outer part of the substrate 800 such that the amorphous silicon layer 806 is in direct contact with the portion of the exposed gate line 802.

Figure 13:
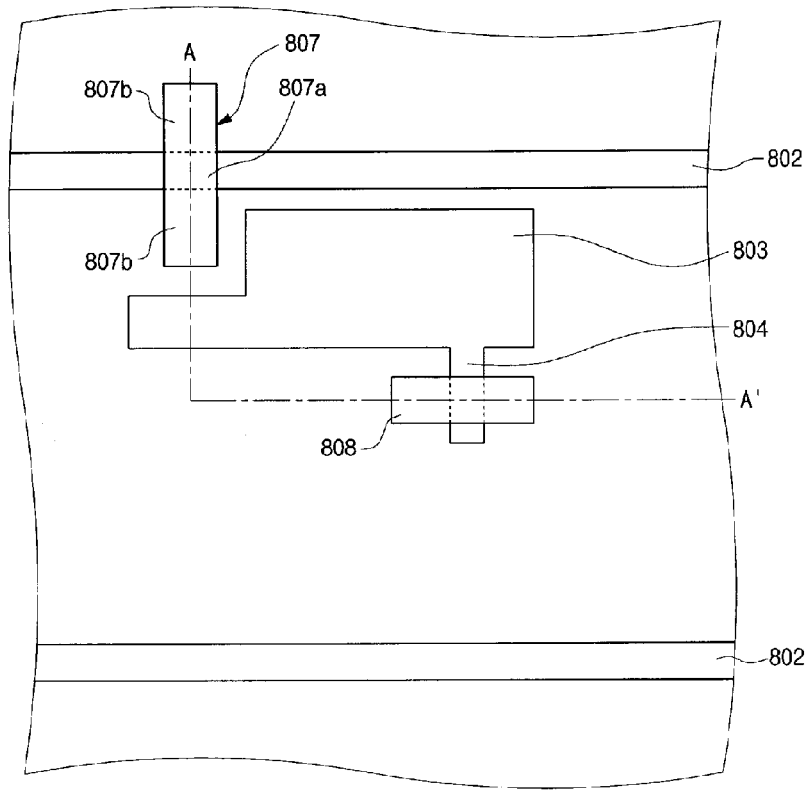
Figure 14:
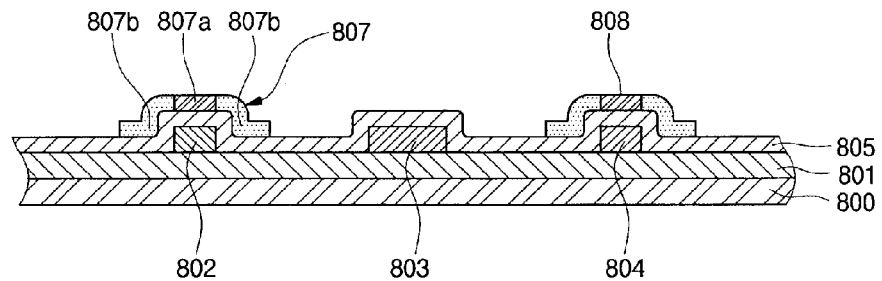

Referring to FIGS. 13 and 14, a region overlapping the gate line 802 patterns a silicon layer formed as a polysilicon layer to form a semiconductor layer 807 of a switching thin film transistor. At this time, the semiconductor layer 807 of the switching thin film transistor is patterned to cross the gate line 802 to be perpendicular to the gate line 802. The semiconductor layer 807 is disposed perpendicular to the gate line 802, i.e., a line connecting source and drain regions of the semiconductor layer 807 is perpendicular to the gate line 802.

When a separate crystallization process is not further performed, a channel region 807a of the semiconductor layer 807 overlapping the gate line 802 is a polysilicon layer, and a region 807b not overlapping the gate line 802 may be an amorphous silicon layer.

A semiconductor layer 808 of the drive thin film transistor may pattern the silicon layer to form a semiconductor layer using an amorphous silicon layer, or a separate crystallization process may be performed to form a semiconductor layer using a polysilicon layer.

Meanwhile, the semiconductor layer 808 of the drive thin film transistor is patterned to cross the gate electrode 804 of the drive thin film transistor and to be perpendicular to the gate electrode 804. A certain region of the semiconductor layer 808 overlaps the gate electrode 804. The semiconductor layer 808 is parallel to the gate line 802.

Then, a photoresist pattern (not shown) is formed on a region in which the semiconductor layers 807 and 808 overlap the gate line 802 and the gate electrode 804, and P- or N-type impurities are implanted to form source and drain regions using the photoresist pattern as a mask.

Figure 15:
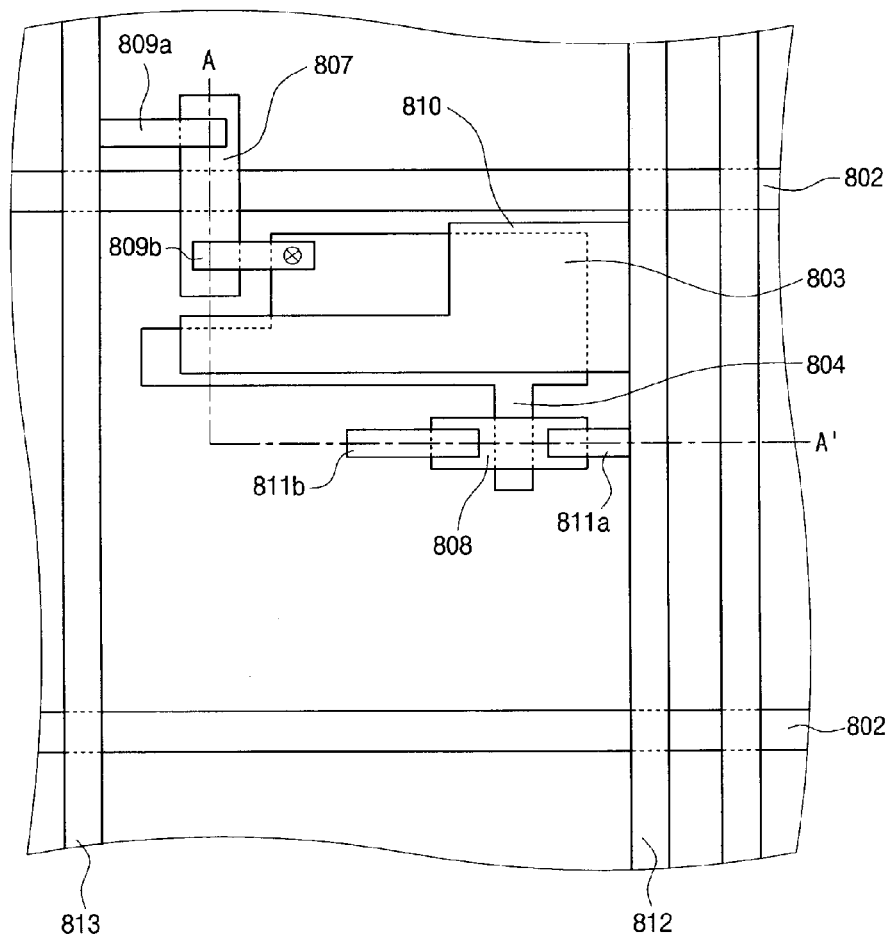
Figure 16:
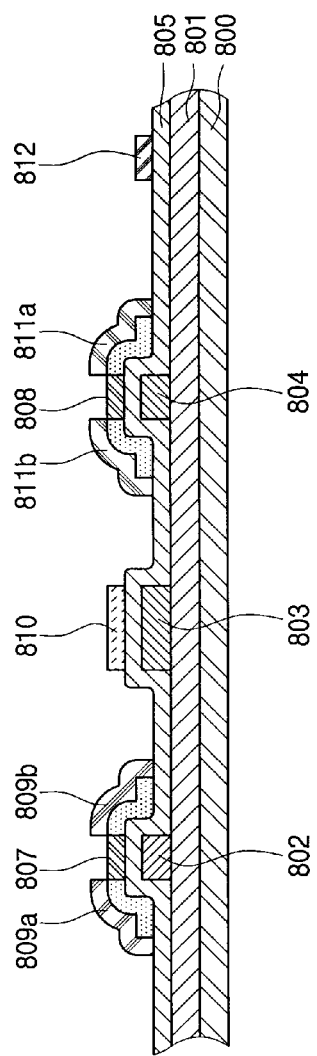

Next, referring to FIGS. 15 and 16, the photoresist pattern is removed, source and drain electrodes 809a and 809b are formed on source and drain regions of the switching thin film transistor, source and drain electrodes 811a and 811b are formed on source and drain regions of the drive thin film transistor, a data line 813 is formed to be connected to the source electrode 809a of the switching thin film transistor and cross the gate line 802, a common power line 812 is formed to be connected to the source electrode 811a of the drive thin film transistor, to cross the gate line 802, and to be parallel to the data line 813, and an upper electrode 810 of the capacitor is formed to be connected to the common power line 812.

Figure 17:
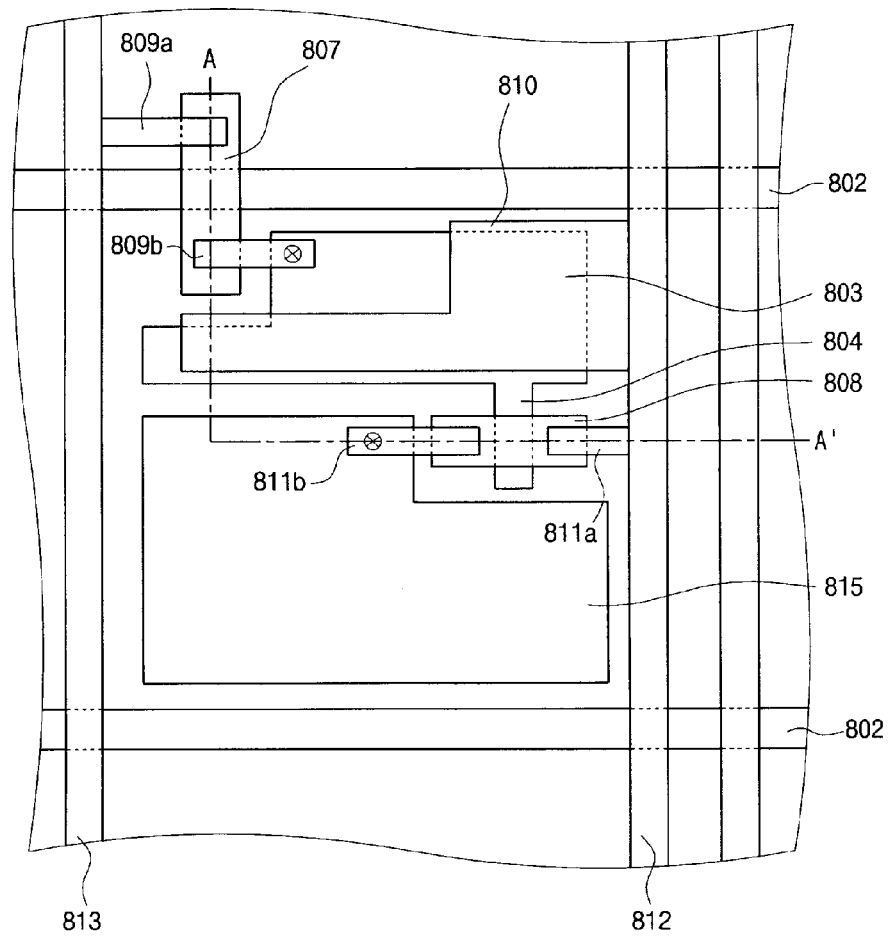
Figure 18:
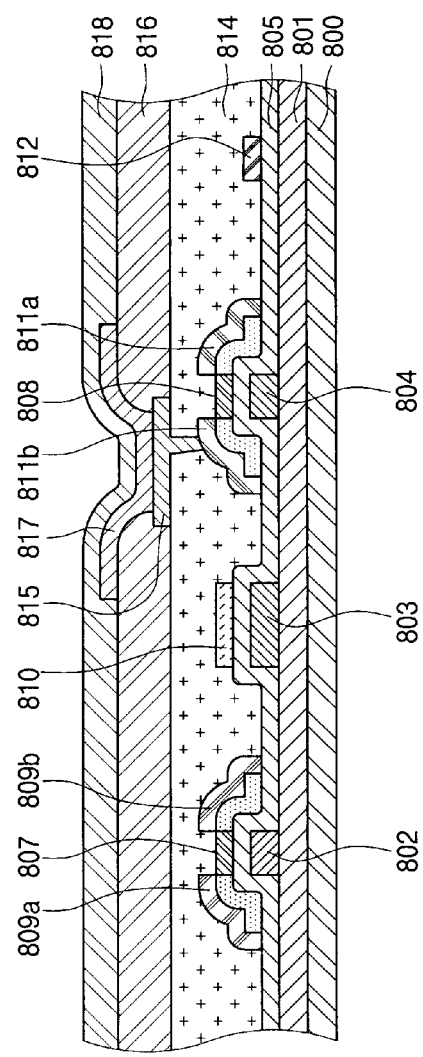

Then, referring to FIGS. 17 and 18, a passivation layer 814 is formed on the substrate 800, a via-hole is formed to expose a portion of the drain electrode 811b of the drive thin film transistor, and then, a first electrode 815 is formed to be connected to the drain electrode 811b through the via-hole. The first electrode 815 may be formed as a transparent electrode using transparent conductor such as indium tin oxide (ITO) or indium zinc oxide (IZO). In addition, the first electrode 815 may be formed as a dual structure constituted by a transparent conductor and a reflective layer by forming the reflective layer using aluminum (Al) or silver (Ag) and then forming the transparent conductor.

A pixel defining layer 816 is formed to expose a portion of the first electrode 815, an organic layer 817 including an emission layer is formed on the exposed first electrode 815, and then, a second electrode 818 is formed thereon. The second electrode 818 may be formed of aluminum, calcium, magnesium, magnesium-silver (Mg—Ag), or the like.

While the invention has been shown and described with reference to certain example embodiments thereof, it will be understood by those skilled in the art that various changes in form and details may be made therein without departing from the spirit and scope of the invention as defined by the appended claims.

The invention claimed is:

1. A method of fabricating a thin film transistor, comprising:
    forming a gate line disposed in one direction on a substrate, the gate line being straight;
    sequentially forming a gate insulating layer and an amorphous silicon layer on an entire surface of the substrate;
    applying an electric field to the gate line to crystallize the amorphous silicon layer formed on a region overlapping the gate line into a polysilicon layer;
    patterning a silicon layer, in which the region overlapping the gate line is crystallized into the polysilicon layer, to form a semiconductor layer crossing the gate line; and
    forming source and drain electrodes connected to source and drain region of the semiconductor layer,
    wherein the semiconductor layer has a channel region formed of the polysilicon layer at a region overlapping the gate line and the source and drain regions formed of the amorphous silicon layer at a region not overlapping the gate line.

2. The method according to claim 1, wherein the semiconductor layer is patterned to be perpendicular to the gate line.

3. The method according to claim 1, wherein the substrate is preheated before applying an electric field to the gate line.

4. The method according to claim 1, wherein the applying of the electric field to the gate line includes applying energy of a power density capable of heating the gate line to a temperature of 1300° C. or more.

5. A method of fabricating a flat panel display device, comprising:
- forming a gate line disposed in one direction, the gate line being straight and a lower electrode of a capacitor on a substrate;
- sequentially forming a gate insulating layer and an amorphous silicon layer on an entire surface of the substrate;
- applying an electric field to the gate line to crystallize the amorphous silicon layer formed on a region overlapping the gate line into a polysilicon layer;
- patterning a silicon layer, in which the region overlapping the gate line is formed of the polysilicon layer, to form a semiconductor layer crossing the gate line; and
- forming source and drain electrodes connected to source and drain regions of the semiconductor layer, a data line disposed perpendicular to the gate line and an upper electrode of the capacitor,
- wherein the semiconductor layer has a channel region formed of the polysilicon layer at a region overlapping the gate line and the source and drain regions formed of the amorphous silicon layer at a region not overlapping the gate line.

6. The method according to claim 5, wherein the semiconductor layer is patterned to be perpendicular to the gate line.

7. The method according to claim 5, wherein the substrate is preheated before applying an electric field to the gate line.

8. The method according to claim 5, wherein the applying of the electric field to the gate line includes applying energy of a power density capable of heating the gate line to a temperature of 1300° C. or more.

* * * * *